United States Patent [19]

Li

[11] Patent Number: 5,252,382
[45] Date of Patent: Oct. 12, 1993

[54] INTERCONNECT STRUCTURES HAVING PATTERNED INTERFACES TO MINIMIZE STRESS MIGRATION AND RELATED ELECTROMIGRATION DAMAGES

[75] Inventor: Che-Yu Li, Ithaca, N.Y.

[73] Assignee: Cornell Research Foundation, Inc., Ithaca, N.Y.

[21] Appl. No.: 753,848

[22] Filed: Sep. 3, 1991

[51] Int. Cl.⁵ .................................................. B32B 9/00
[52] U.S. Cl. .................................. 428/209; 428/210; 428/901; 428/195
[58] Field of Search ............... 428/209, 210, 901, 195

[56] References Cited

U.S. PATENT DOCUMENTS

| | | | |
|---|---|---|---|
| 4,107,726 | 8/1978 | Schilling | 357/71 |
| 4,424,251 | 1/1984 | Sugishita et al. | 428/209 |
| 4,451,326 | 5/1984 | Gwozdz | 156/643 |
| 4,508,749 | 4/1985 | Brannon et al. | 427/43.1 |
| 4,725,877 | 2/1988 | Brasen et al. | 357/71 |
| 4,774,127 | 9/1988 | Reagan et al. | 428/209 |
| 4,782,380 | 11/1988 | Shankar et al. | 357/71 |
| 4,786,962 | 11/1988 | Koch | 357/71 |
| 4,824,716 | 4/1989 | Yerman | 428/209 |
| 4,824,803 | 4/1989 | Us et al. | 437/192 |
| 4,841,354 | 6/1989 | Inaba | 357/71 |
| 4,881,118 | 11/1989 | Niwayama et al. | 357/79 |
| 4,884,120 | 11/1989 | Mochizuki et al. | 357/68 |

OTHER PUBLICATIONS

Hey, H. P. W. et al., "Selective Tungsten on Aluminum for Improved VLSI Interconnects", IEDM 86, pp. 50-53, 1987.

Jackson, M. S. et al., "Stress Relaxation and Hillock Growth in Thin Films", Acta Metall., vol. 30, pp. 1993-2000, 1982.

Puttlitz, A. F. et al., "Semiconductor Interlevel Shorts Caused by Hillock Formation in Al-Cu Metallization", IEEE, vol. 12, No. 4, pp. 619-626, 1989.

Primary Examiner—Patrick J. Ryan
Assistant Examiner—Cathy Lee
Attorney, Agent, or Firm—Jones, Tullar & Cooper

[57] ABSTRACT

Interconnect structures for integrated circuits and semiconductor chips are disclosed which employ patterned interfaces to minimize stress migration in the interconnects. The interfaces are patterned to have regions of substantially no adhesion and other regions of good adhesion. The regions of substantially no adhesion reduce stress migration in the interconnect, while the regions of good adhesion ensure adequate thermal contact, fabricability and mechanical integrity of the interconnect structures. The patterned interfaces can be formed either by treating the surfaces of the interconnect or adjacent insulator and passivation layers, or by forming patterned interlayers of material in the interfaces. Multiple layer interconnects can also be formed which incorporate similarly patterned interfaces.

15 Claims, 2 Drawing Sheets

INTERCONNECT STRUCTURES HAVING PATTERNED INTERFACES TO MINIMIZE STRESS MIGRATION AND RELATED ELECTROMIGRATION DAMAGES

BACKGROUND OF THE INVENTION

The present invention relates in general to interconnect structures for integrated circuits on a semiconductor chip wherein patterned interfaces are applied to or formed in the interconnects to alter and optimize the stress state which is imparted to the interconnects from adjacent insulator or passivation layers.

The metallization systems used in integrated circuits on a semiconductor chip often include several layers of narrow and thin metal interconnects which are separated by insulator or passivation layers and are connected by vias through the same. More particularly, the narrow and thin metal interconnects are deposited on an insulator layer that covers the semiconductor chip and are connected to the underlying devices in the chip through holes or vias drilled through the insulator layer. The interconnects are covered by a passivation layer for corrosion and electromigration resistance.

Good adhesion between the metal interconnects and their surrounding passivation and insulator layers is important to produce good thermal contact in order to dissipate the heat generated in the interconnects when a high current is passed therethrough. The adhesion is also important to facilitate the fabrication of the interconnect structure.

To improve the reliability of aluminum based interconnects, a refractory metal underlayer, top layer or both have been used. The refractory metals are typically tungsten, titanium or their alloys. A thin titanium layer can also be sandwiched in the aluminum based interconnect. These refractory metal layers maintain electrical continuity even when the aluminum alloy layer is severed by stress migration or electromigration damage.

Stress migration produces two forms of damages. When large tensile stresses are present in the metal interconnects, the formation of stress-induced voids will occur. Sufficiently large voids will increase the line resistance or sever the interconnect. On the other hand, when large compressive stresses are present, the formation of stress induced hillocks, which are protrusions growing out of the interconnect, will occur. Sufficiently large hillocks will fracture the passivation layer thus producing shorts between interconnects and exposing the interconnects to the external environment.

Whether the state of stress in an interconnect is compressive or tensile depends on the passivation temperature, the post passivation heat treatment or processing temperatures and the extent of stress relaxation during a temperature hold. In general, if the passivation temperature is higher or equal to the maximum temperature during a post passivation temperature excursion, the state of stress in the interconnect will be mainly tensile in the absence of substantial stress relaxation.

If stress-migration induced voids are present in an interconnect, although they may not be large enough by themselves to increase the interconnect resistance or sever the interconnect, they will grow and migrate under an applied high electrical current. Void coalescence will occur due to void velocity distribution because the migration velocity of a void varies depending on its size. Void coalescence will result also from other causes such as from variations in electrical current density caused by changes in interconnect geometry. Such void coalescence will increase the interconnect resistance and sever the interconnect in much the same way as stress-migration induced void growth. This form of electromigration damage is thus stress migration related and is considered to be an important electromigration damage process in passivated interconnects. If, however, stress-migration induced voiding is significantly reduced, the electromigration resistance of passivated interconnects will improve.

Strong passivation and insulator layers are necessary to limit electromigration damage produced by high electrical current driven atomic transport. The reason for this is that if the passivation and insulator layers surrounding the interconnect are strong, it is possible to build up a back stress due to electrical current driven atomic transport in the interconnect which will limit continued atomic transport. At the same time, if a metal alloy interconnect is well adhered to the strong passivation and insulator layers to meet the thermal resistance and processing requirements, a strong triaxial tensile stress state will be created in the interconnect when it contracts more than the surrounding layers. For example, the coefficient of thermal expansion of aluminum is significantly larger than that of silicon oxide or silicon nitride which is used to make the surrounding layers so that if the interconnect is made from an aluminum alloy, it will always contract or expand more than the latter during a temperature cycle. The resulting high triaxial tensile stresses are believed to be the cause of stress-migration induced voiding.

SUMMARY OF THE INVENTION

In view of the foregoing, it is the object of the present invention to provide interconnect structures which substantially reduce or eliminate stress migration in the interconnects which can result in stress migration and electromigration damages, such as voids or hillocks.

This and other objects of the present invention are achieved through use of an interconnect structure having patterned interfaces which are formed between the interconnects and their surrounding dielectric passivation and insulator layers, and serve to provide areas of good adhesion between the interconnects and the surrounding layers, as well as areas of very poor or substantially no adhesion between the interconnects and their surrounding layers.

In this arrangement, the areas of poor or substantially no adhesion are sufficiently large to alter the tensile stress state of the interconnects to make them significantly less hydrostatic. When the tensile stress state in the interconnect becomes less hydrostatic thereby significantly decreasing stored elastic strain energy, the chance of forming stress-migration induced voids will be greatly reduced or eliminated. Consequently, electromigration damage produced by electrical current induced void coalescence will also be reduced or eliminated. The areas of good adhesion in the interface are sufficiently large to ensure adequate thermal contact, fabricability and mechanical integrity of the passivation layers.

The patterned interfaces between the interconnects and their surrounding dielectric passivation and insulator layers can be formed by depositing thin interlayers between the interconnects and the passivation or insulator layers that will not adhere to these layers, but will adhere to the interconnects, or vice versa. Alternatively, the areas of poor or substantially no adhesion can be produced by surface modification of the interconnect or passivation and insulator layers.

In another alternative embodiment of the present invention, patterned interfaces are incorporated within a multiple layered interconnect. The multiple layered interconnect preferably includes a bottom refractory metal layer, a middle, metal alloy layer and a top refractory metal layer. The interfaces between the three layers are patterned in the same way as in the other embodiments of the invention with areas of poor or substantially no adhesion to reduce or eliminate stress migration in the middle alloy layer.

The benefit of the patterned interfaces can be maximized when used in conjunction with a high passivation temperature and strong passivation and insulator layers. The former will render the stress state of the interconnect mainly tensile during subsequent temperature cycles to avoid stress-induced hillocks, while the latter will limit damage produced by electrical current driven atomic transport either in the form of hillocks or voids.

BRIEF DESCRIPTION OF THE DRAWINGS

The foregoing and additional objects, features and advantages of the present invention become apparent from the following detailed description of preferred embodiments thereof, taken in conjunction with the accompany drawings in which.

DETAILED DESCRIPTION OF THE PREFERRED EMBODIMENTS

Figure 1:
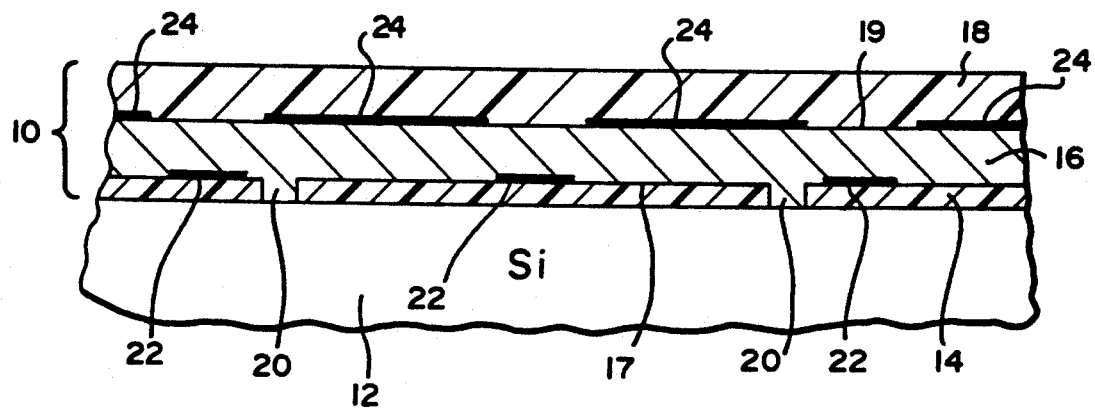
FIG. 1 is a cross sectional view of an interconnect structure for an integrated circuit employing a first preferred embodiment of the present invention.

Turning now to a more detailed consideration of the present invention, illustrated in FIG. 1 is an interconnect structure 10 formed overtop an integrated circuit semiconductor chip 12. The interconnect structure 10 includes a dielectric insulator layer 44 which is formed overtop the chip 12; a metal interconnect 16 which is adhered over a part of its length to the insulator layer 14 and forms a first interface 17 therewith; and, a dielectric passivation layer 18 which is adhered over a part of its length to the metal interconnect 16 and forms a second interface 19 therewith. A plurality of conductive metal filled vias 20 are formed in the insulator layer 14 which electrically connect the interconnect 16 to circuitry (not shown) within the semiconductor chip 12.

The insulator layer 14 and the passivation layer 18 are preferably formed from any suitable insulating material, such as silicon oxide or silicon nitride, while the metal interconnect 16 is preferably formed from a metal alloy, such as an aluminum alloy. Since the coefficient of thermal expansion of an aluminum alloy is significantly larger than that of silicon oxide or silicon nitride, when the interconnect structure 10 is exposed to varying temperatures, the metal interconnect 16 will always contract or expand more than the insulator layer 14 and passivation layer 18. This results in high triaxial stresses being imparted to the metal interconnect 16 which can cause the formation of voids or hillocks therein.

To reduce or minimize stress migration in the metal interconnect 16, each of the interfaces 17 and 19 are patterned to have regions of good adhesion and a number of spaced apart regions of substantially no adhesion. This can be accomplished in a number of different ways. In the embodiment illustrated in FIG. 1, a first thin patterned interlayer 22 is formed at the interface 17 between the insulator layer 14 and the interconnect 16, while a second patterned interlayer 24 is formed between the interconnect 16 and the passivation layer 18. Each of the interlayers 22 and 24 is patterned such that they separate the interconnect 16 from either the insulator layer 14 or the passivation layer 18 at periodic intervals along the length of the interconnect 16.

The patterned interlayers 22 and 24 are made of a material, such as polyimide or photoimagable polyimide, which during the interconnect structure formation process are made to be substantially non-adhering either to the interconnect 16 or either of the insulator or passivation layers 14 and 18. This can be achieved, for example, by first applying and then curing the first patterned interlayer 22 before the interconnect 16 is deposited. Since the interlayer 22 has already been cured, the adhesion between it and the interconnect 16 will be poor, while the adhesion between the first interlayer 22 and the insulator layer 14 will be good. To further ensure poor or substantially no adhesion between the first interlayer 22 and the aluminum interconnect 16, the interlayer 22 can be plasma treated to increase the cross-link of molecules at its top surfaces.

In a similar manner, the second interlayer 24 can be applied to the interconnect 16 and cured, after which the passivation layer is deposited over the interconnect 16 and the second patterned interlayer 24. As a result, good adhesion will be obtained between the passivation layer 18 and the interconnect 16, and between the second patterned interlayer 24 and the interconnect 16, while poor or substantially no adhesion will occur between the passivation layer 18 and the second interlayer 24.

Figure 2:
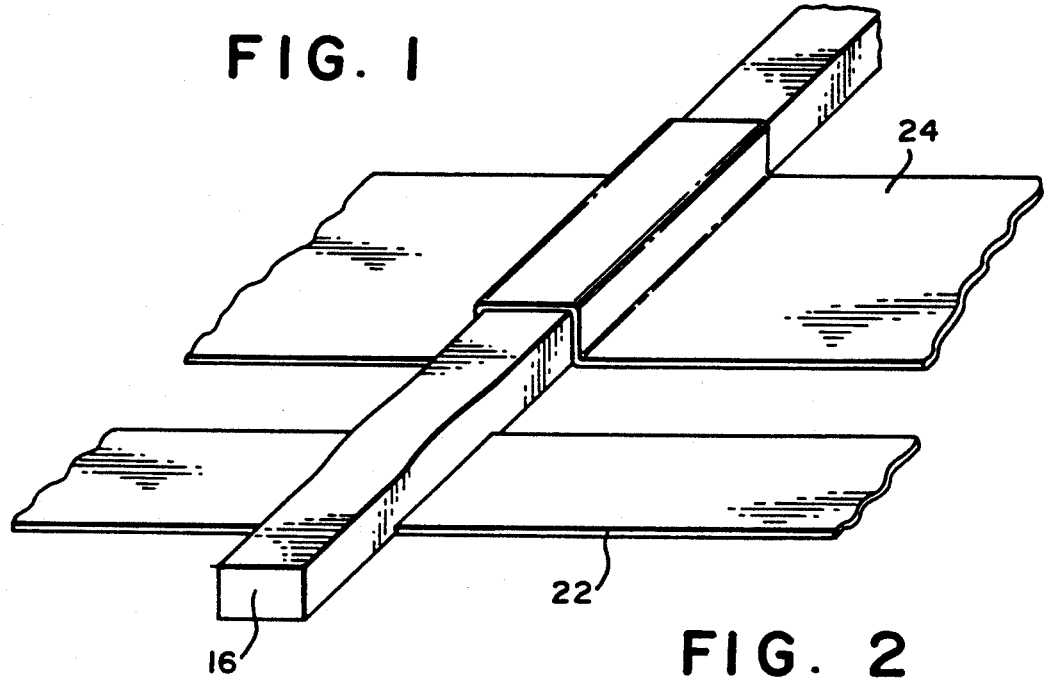
FIG. 2 is a perspective view of a portion of the structure illustrated in FIG. 1.

As illustrated in FIG. 2, the metal interconnect 16 is deposited and formed overtop the first patterned interlayer 22 by using any conventional, known technique. The second patterned interlayer 24 is then formed overtop of the interconnect 16 such that it conformally covers the top and the sides of the interconnect 16. When the interconnect 16 is of a rectangular or nearly square cross section as illustrated in FIG. 2, and has good adhesion at its entire interface to the surrounding passivation and insulator layers, it is constrained in such a way that its triaxial tensile stress state will be nearly hydrostatic. The nearly hydrostatic stress state corresponds to the highest stored elastic strain energy and favors the formation of stress-migration induced voids.

As illustrated in FIG. 2, the part of the interconnect 16 underneath the second patterned interlayer 24 will be well adhered to its surroundings only at the interface facing the underlying insulator layer 14. The tensile stress state in this part will therefore significantly deviate from the hydrostatic state and the chance of formation of stress-migration induced voids will thus be greatly reduced, if not eliminated. Similarly, the part of the interconnect 16 above the first patterned interlayer 22 will also have a stress state different from the hydrostatic state. The resulting reduction or elimination of stress-migration induced voiding means also improved electromigration damage resistance in passivated interconnects.

The thin patterned interlayers 22 and 24 can be made of other materials including polymers, metals, semiconductors and inorganic insulators such as ceramics or glasses. The interlayers can be modified for example by a variety of surface or curing treatment to achieve different adhesion properties at their top and bottom surfaces for the purposes of the invention. They also can be made of a top and bottom layer of two different materials or gradation of materials, and can be used with or without treatment.

Figure 3:
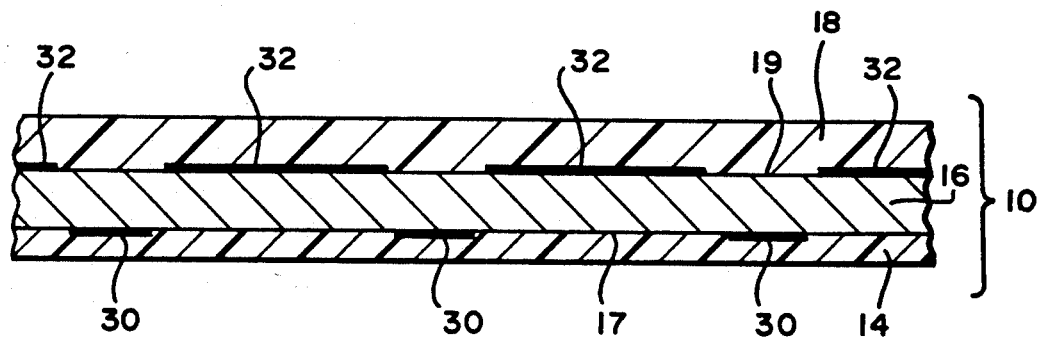
FIG. 3 is a cross sectional view of a portion of an interconnect structure employing a second preferred embodiment of the present invention.

Alternatively, as illustrated in FIG. 3, a plurality of non-adhering or substantially non-adhering areas indicated by 30 and 32 can be made in the interfaces 17 and 19, respectively, by simply modifying the surfaces of the insulator and passivation layers 14 and 18 facing the interconnect 16 by ion implantation, or other suitable means. This alternative eliminates the need for depositing separate interlayers.

Figure 4:
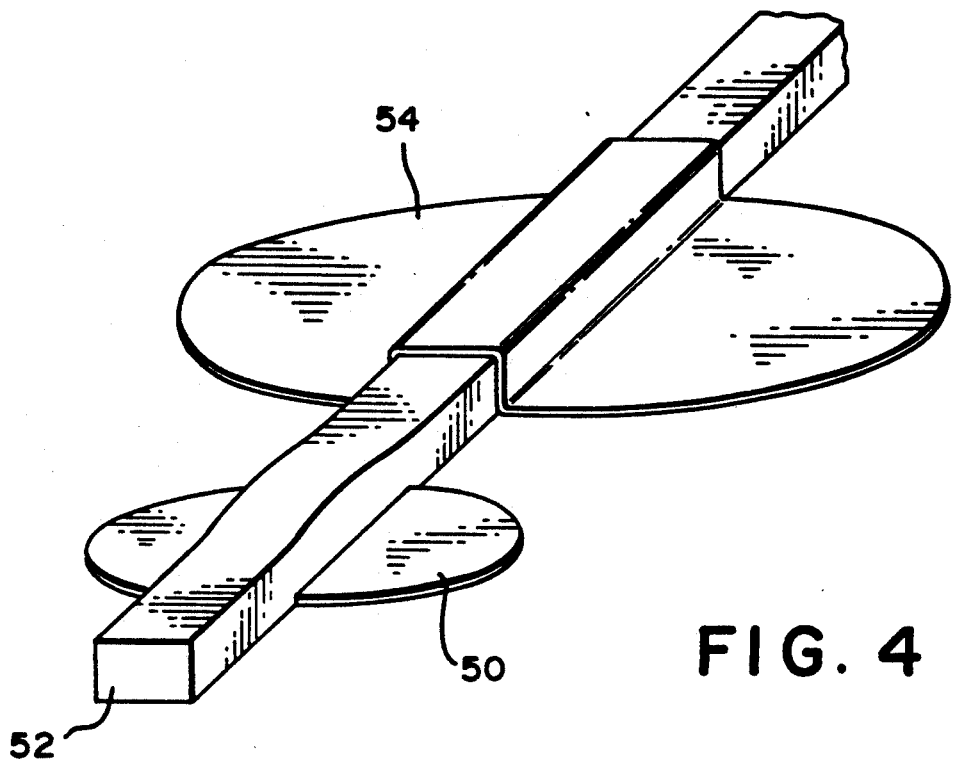
FIG. 4 is a perspective view of a portion of an interconnect structure employing a third preferred embodiment of the present invention.

The size, shape and location of non-adhering or poorly adhering areas can be selected in any desired manner as long as they are optimized to achieve adequate thermal contact, fabricability and mechanical integrity of the passivation layer 18, and to minimize or eliminate stress-migration induced voiding. For example, FIG. 4 illustrates another embodiment of the invention in which a first circular shaped interlayer 50 is formed beneath an interconnect 52, and a second circular shaped interlayer 54 is formed overtop the interconnect 52.

Figure 5:
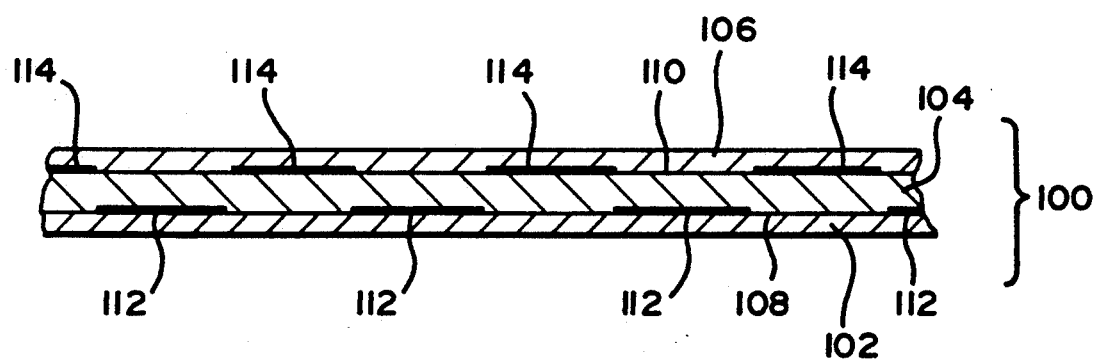
FIG. 5 is a cross sectional view of a multiple layer interconnect which forms a fourth preferred embodiment of the present invention.

Another embodiment of the present invention is illustrated in FIG. 5 which can be employed with interconnects having multiple layer structures. In particular, a multiple layer interconnect 100 is illustrated in FIG. 5 which includes a refractory metal bottom layer 102, a middle, metal alloy layer 104 and a refractory metal top layer 106. The refractory metals are typically tungsten, titanium or their alloys, while the middle, metal alloy layer is typically an aluminum alloy. The refractory metal layers 102 and 106 maintain electrical continuity even when the metal alloy layer 104 is severed by stress migration or electromigration damage.

With the above structure, a first patterned interface 108 can be formed between the bottom refractory metal layer 102 and the metal alloy layer 104, while a second patterned interface 110 can be formed between the metal alloy layer 104 and the top refractory metal layer 106 to achieve the same results as are achieved with the other embodiments of the present invention. In the embodiment illustrated in FIG. 5, the first and second patterned interfaces 108 and 110 are formed by first and second patterned interlayers 112 and 114, which are made to be poorly or substantially non-adhering to the metal alloy layer 104, and the refractory metal layer 106 respectively. This again will result in reduction or elimination of stress-migration induced voids in the metal alloy layer 104.

Although the present invention has been disclosed in terms of a number of preferred embodiments, it will be understood that numerous modifications and variations could be made thereto without departing from the spirit and scope of the invention as defined by the following claims.

What is claimed is:

1. An interconnect structure comprising:
   a) a first dielectric layer;
   b) a metal interconnect formed over said first dielectric layer and forming a first interface therewith; and,
   c) a second dielectric layer formed over said metal interconnect and forming a second interface therewith;
   wherein, said first and second interfaces are patterned to have regions of good adhesion and regions of substantially no adhesion;
   whereby, stress migration in said interconnect is reduced or eliminated.

2. The interconnect structure of claim 1 wherein said regions of substantially no adhesion in said interfaces are formed by modifying portions of mating surfaces of said dielectric layers and said interconnect using ion implantation.

3. An electrical interconnect structure for an integrated circuit comprising:
   a) a first dielectric layer;
   b) a first patterned interlayer formed overtop said first dielectric layer;
   c) a metal interconnect formed overtop said first dielectric layer and said first patterned interlayer, said interconnect being adhered to said first dielectric layer, and substantially not adhered to said first patterned interlayer;
   d) a second patterned interlayer formed overtop said interconnect layer; and,
   e) a second dielectric layer formed overtop said interconnect and said second patterned interlayer, said second dielectric layer being adhered to said interconnect and substantially not adhered to said second patterned interlayer,
   whereby, stress migration in said interconnect will be substantially reduced by said first and second patterned interlayers.

4. The interconnect structure of claim 3, wherein said first and second patterned interlayers include a plurality of circular shaped regions.

5. The interconnect structure of claim 3, wherein said first and second patterned interlayers include a plurality of rectangular shaped regions.

6. The structure of claim 3, wherein said first and second patterned interlayers are formed from cured polyimide.

7. The structure of claim 6, wherein said first and second patterned interlayers are formed from plasma treated cured polyimide.

8. A multiple layer metal interconnect comprising:
   a) a bottom metal layer;
   b) a middle metal layer forming a first interface with said bottom metal layer; and,
   c) a top metal layer forming a second interface with said middle metal layer;
   wherein said first and second interfaces are patterned with regions of good adhesion and a plurality of regions with substantially no adhesion,
   whereby, stress migration in said middle layer is reduced.

9. The multiple layer metal interconnect of claim 8, wherein said bottom and top layers are formed from refractory metal, and said middle layer is formed from a metal alloy.

10. The structure of claim 9, wherein said middle layer is formed from aluminum alloy and said bottom and top layers are formed from tungsten, titanium or their alloys.

11. The structure of claim 8, wherein said first and second interfaces are patterned by forming a first patterned interlayer between said bottom metal layer and said middle metal layer; and a second patterned interlayer between said middle metal layer and said top metal layer.

12. The structure of claim 11, wherein said first and second patterned interlayers are formed from cured polyimide.

13. The structure of claim 11, wherein said first and second patterned interlayers are formed from plasma treated cured polyimide.

14. An interconnect structure comprising:
a) a first dielectric layer;
b) a metal interconnect formed over said first dielectric layer and forming a first interface therewith; and,
c) a second dielectric layer formed over said metal interconnect and forming a second interface therewith;
wherein, said first and second interfaces are patterned to have regions of adhesion and regions of substantially no adhesion;
whereby, stress migration in said interconnect is reduced or eliminated.

15. A multiple layer metal interconnect comprising:
a) a bottom metal layer;
b) a middle metal layer forming a first interface with said bottom metal layer; and,
c) a top metal layer forming a second interface with said middle metal layer;
wherein said first and second interfaces are patterned with regions of adhesion and a plurality of regions with substantially no adhesion,
whereby stress migration in said middle layer is reduced.

* * * * *